(12) United States Patent
Horii et al.

(10) Patent No.: US 10,050,109 B2
(45) Date of Patent: Aug. 14, 2018

(54) SILICON CARBIDE SEMICONDUCTOR SUBSTRATE, METHOD FOR MANUFACTURING SILICON CARBIDE SEMICONDUCTOR SUBSTRATE, AND METHOD FOR MANUFACTURING SILICON CARBIDE SEMICONDUCTOR DEVICE

(71) Applicant: Sumitomo Electric Industries, Ltd., Osaka-shi (JP)

(72) Inventors: Taku Horii, Osaka (JP); Ryosuke Kubota, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 57 days.

(21) Appl. No.: 14/910,182

(22) PCT Filed: Jun. 13, 2014

(86) PCT No.: PCT/JP2014/065712
§ 371 (c)(1),
(2) Date: Feb. 4, 2016

(87) PCT Pub. No.: WO2015/019707
PCT Pub. Date: Feb. 12, 2015

(65) Prior Publication Data
US 2016/0181375 A1    Jun. 23, 2016

(30) Foreign Application Priority Data
Aug. 6, 2013 (JP) .................................. 2013-163406

(51) Int. Cl.
*H01L 29/36*    (2006.01)
*H01L 29/16*    (2006.01)
(Continued)

(52) U.S. Cl.
CPC .... *H01L 29/1608* (2013.01); *H01L 21/02002* (2013.01); *H01L 21/0262* (2013.01);
(Continued)

(58) Field of Classification Search
CPC ...... C30B 29/36; C30B 23/025; Y10T 428/21
See application file for complete search history.

(56) References Cited

U.S. PATENT DOCUMENTS

| | | |
|---|---|---|
| 5,952,679 A | 9/1999 | Kitou et al. |
| 2006/0225645 A1 | 10/2006 | Powell et al. |

(Continued)

FOREIGN PATENT DOCUMENTS

| | | |
|---|---|---|
| JP | 2007-201155 A | 8/2007 |
| JP | 2012-214376 A | 11/2012 |

(Continued)

OTHER PUBLICATIONS

Extended European Search Report in counterpart European Patent Application No. 14834133.2, dated Feb. 16, 2017.
Ellison et al., "Wafer warpage, crystal bending and interface properties of 4H-SiC epi-wafers," Diamond and Related Materials vol. 6, 1997, pp. 1369-1373.
(Continued)

*Primary Examiner* — Thomas L Dickey
(74) *Attorney, Agent, or Firm* — Venable LLP; Michael A. Sartori; Laura G. Remus (57) ABSTRACT

A silicon carbide semiconductor substrate includes: a base substrate that has a main surface having an outer diameter of not less than 100 mm and that is made of single-crystal silicon carbide; and an epitaxial layer formed on the main surface. The silicon carbide semiconductor substrate has an amount of warpage of not less than −100 μm and not more than 100 μm when a substrate temperature is a room temperature and has an amount of warpage of not less than −1.5 mm and not more than 1.5 mm when the substrate temperature is 400° C.

3 Claims, 6 Drawing Sheets

(51) Int. Cl.
- *H01L 21/02* (2006.01)
- *H01L 21/04* (2006.01)
- *H01L 29/66* (2006.01)
- *H01L 29/78* (2006.01)
- *H01L 29/06* (2006.01)
- *H01L 21/306* (2006.01)
- *H01L 21/3065* (2006.01)
- *H01L 21/311* (2006.01)

(52) U.S. Cl.
CPC .. *H01L 21/02236* (2013.01); *H01L 21/02378* (2013.01); *H01L 21/02428* (2013.01); *H01L 21/02529* (2013.01); *H01L 21/046* (2013.01); *H01L 21/047* (2013.01); *H01L 21/0475* (2013.01); *H01L 21/3065* (2013.01); *H01L 21/30625* (2013.01); *H01L 21/31111* (2013.01); *H01L 29/0619* (2013.01); *H01L 29/66068* (2013.01); *H01L 29/7811* (2013.01); *H01L 21/02255* (2013.01)

(56) References Cited

U.S. PATENT DOCUMENTS

| | | | |
|---|---|---|---|
| 2006/0278891 A1* | 12/2006 | Saxler | C30B 29/36 257/192 |
| 2010/0093161 A1 | 4/2010 | Kusumoto et al. | |
| 2013/0032822 A1 | 2/2013 | Ishibashi | |
| 2013/0153925 A1 | 6/2013 | Masuda | |

FOREIGN PATENT DOCUMENTS

| | | |
|---|---|---|
| JP | 2013-118213 A | 6/2013 |
| JP | 2013-128050 A | 6/2013 |
| WO | WO-2008/120467 A1 | 10/2008 |
| WO | WO-2012/049792 A1 | 4/2012 |

OTHER PUBLICATIONS

International Search Report in International Application No. PCT/JP2014/065712, dated Sep. 22, 2014.

* cited by examiner

SILICON CARBIDE SEMICONDUCTOR SUBSTRATE, METHOD FOR MANUFACTURING SILICON CARBIDE SEMICONDUCTOR SUBSTRATE, AND METHOD FOR MANUFACTURING SILICON CARBIDE SEMICONDUCTOR DEVICE

TECHNICAL FIELD

The present invention relates to a silicon carbide semiconductor substrate, a method for manufacturing the silicon carbide semiconductor substrate, and a method for manufacturing a silicon carbide semiconductor device, in particular, a silicon carbide semiconductor substrate having a high degree of flatness even when thermally treated at a high temperature, a method for manufacturing the silicon carbide semiconductor substrate, and a method for manufacturing a silicon carbide semiconductor device.

BACKGROUND ART

In recent years, silicon carbide (SiC) crystals have been adopted as semiconductor substrates for use in manufacturing semiconductor devices. SiC has a band gap larger than that of silicon (Si), which has been used more commonly. Hence, a semiconductor device employing SiC advantageously has a high breakdown voltage, low on resistance, and properties less likely to decrease in a high temperature environment.

Further, in order to manufacture silicon carbide semiconductor devices efficiently, silicon carbide semiconductor substrates have begun to be provided with a larger diameter. However, when a silicon carbide semiconductor substrate is provided with an outer diameter of, for example, about 6 inches, the silicon carbide semiconductor substrate becomes less flat.

Japanese Patent Laying-Open No. 2012-214376 describes a SiC wafer having a diameter of at least about 75 millimeters (3 inches), a distortion of less than about 5 μm, a warpage of less than about 5 mm, and a TTV of less than about 2.0 μm. Specifically, it is described that a SiC boule is sliced thinly into a form of wafer, and the thinly sliced wafer is placed on a double-sided lapper to start a lapping process using downward force smaller than downward force necessary to bend the wafer, thereby producing a wafer having low distortion, warpage, and TTV.

CITATION LIST

Patent Document

PTD 1: Japanese Patent Laying-Open No. 2012-214376

SUMMARY OF INVENTION

Technical Problem

However, it is confirmed that some silicon carbide semiconductor substrates have a low degree of flatness due to a high-temperature heat treatment even if the silicon carbide semiconductor substrates have had warpage and TTV each falling within the range described in Japanese Patent Laying-Open No. 2012-214376 under a room temperature. For example, generally in a method for manufacturing a silicon carbide semiconductor device, doping is performed by way of ion implantation under a high temperature; however, it is difficult to suction a silicon carbide semiconductor substrate having a low degree of flatness onto an electrostatic chuck stage of the implantation device, and in some cases, it has been confirmed that substrates become broken, disadvantageously.

Moreover, ion implantation into such a silicon carbide semiconductor substrate having a low degree of flatness causes formation of the following regions: a region having a surface perpendicular to the ion implantation direction; and a region having a surface not perpendicular to the ion implantation direction and inclined relative to the ion implantation direction. This leads to variation in the shapes of impurity regions formed in the silicon carbide semiconductor substrates.

Moreover, such a low degree of flatness caused under a high temperature is a particularly serious problem in a silicon carbide semiconductor substrate having a large diameter of not less than 100 mm. Specifically, even though a silicon carbide semiconductor substrate having a large diameter (particularly not less than 100 mm) is used to obtain silicon carbide semiconductor devices efficiently, the low degree of flatness caused as described above makes it difficult to produce silicon carbide semiconductor devices with good yield.

The present invention has been made to solve the above problem. The present invention has a main object to provide a silicon carbide semiconductor substrate having a high degree of flatness even under a high temperature, a method for manufacturing the silicon carbide semiconductor substrate, and a method for manufacturing a silicon carbide semiconductor device. Another object is to provide a method for manufacturing a silicon carbide semiconductor device to produce silicon carbide semiconductor devices with good yield using a silicon carbide semiconductor substrate having a large diameter.

Solution to Problem

A silicon carbide semiconductor substrate according to the present invention includes: a base substrate that has a main surface having an outer diameter of not less than 100 mm and that is made of single-crystal silicon carbide; and an epitaxial layer formed on main surface. The silicon carbide semiconductor substrate has an amount of warpage of not less than −100 μm and not more than 100 μm when a substrate temperature is a room temperature and has an amount of warpage of not less than −1.5 mm and not more than 1.5 mm when the substrate temperature is 400° C.

A method for manufacturing a silicon carbide semiconductor device according to the present invention includes steps of: preparing a base substrate that has a main surface having an outer diameter of not less than 100 mm and that is made of single-crystal silicon carbide; forming an epitaxial layer on the main surface; preparing a silicon carbide semiconductor substrate by removing at least a portion of a backside surface of the base substrate opposite to the main surface; and implanting an impurity ion into the silicon carbide semiconductor substrate.

Advantageous Effects of Invention

According to the present invention, there can be obtained a silicon carbide semiconductor substrate having a high degree of flatness even under a high temperature. Moreover, there can be provided a method for manufacturing a silicon carbide semiconductor device to produce silicon carbide semiconductor devices with good yield.

DESCRIPTION OF EMBODIMENTS

[Description of Embodiment of the Invention of the Present Application]

The following describes an embodiment of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ) and a group plane is represented by { }. In addition, a negative crystallographic index is normally expressed by putting "−" (bar) above a numeral, but is expressed by putting the negative sign before the numeral in the present specification.

First, overview of an embodiment of the present invention is listed.

Figure 1:
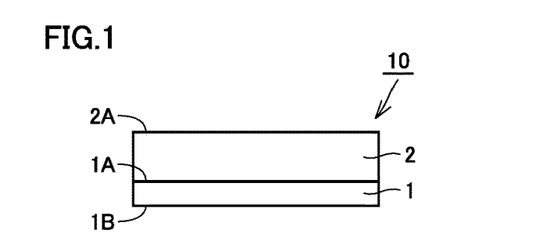
FIG. 1 is a schematic view of a silicon carbide semiconductor substrate according to an embodiment.
Figure 2:
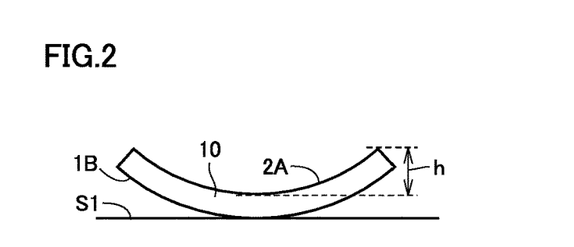
FIG. 2 is a schematic view for illustrating the definition of an amount of warpage in the silicon carbide semiconductor substrate.
Figure 3:
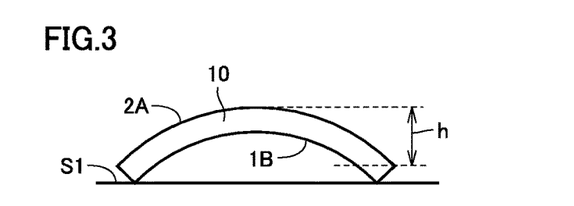
FIG. 3 is a schematic view for illustrating the definition of the amount of warpage in the silicon carbide semiconductor substrate.

(1) With reference to FIG. 1, a silicon carbide semiconductor substrate 10 according to the present embodiment includes: a base substrate 1 that has a main surface 1A having an outer diameter of not less than 100 mm and that is made of single-crystal silicon carbide; and an epitaxial layer 2 formed on main surface 1A, silicon carbide semiconductor substrate 10 having an amount of warpage of not less than −100 μm and not more than 100 μm when a substrate temperature is a room temperature and having an amount of warpage of not less than −1.5 mm and not more than 1.5 mm when the substrate temperature is 400° C. Here, with reference to FIG. 2 and FIG. 3, the term "amount of warpage" of silicon carbide semiconductor substrate 10 is intended to indicate a difference between the height of the highest location and the height of the lowest location relative to a plane S1 in main surface 2A of silicon carbide semiconductor substrate 10 when silicon carbide semiconductor substrate 10 is placed on plane S1. Here, with reference to FIG. 2, a negative value of the amount of warpage represents a case where main surface 2A of silicon carbide semiconductor substrate 10 projects downward (a case where the central position of silicon carbide semiconductor substrate 10 is lower than the outer circumference position thereof relative to plane S1), whereas with reference to FIG. 3, a positive value of the amount of warpage represents a case where main surface 2A of silicon carbide semiconductor substrate 10 projects upward (a case where the central position of silicon carbide semiconductor substrate 10 is higher than the outer circumference position thereof relative to plane S1). Moreover, the term "substrate temperature" is intended to indicate a temperature measured by a radiation thermometer from the main surface 2A side of silicon carbide semiconductor substrate 10 in a semiconductor manufacturing apparatus such as an ion implantation apparatus, for example. It should be noted that silicon carbide semiconductor substrate 10 according to the present embodiment is a large-diameter substrate having an outer diameter of not less than 100 mm, preferably not less than 125 mm, and more preferably not less than 150 mm.

That is, silicon carbide semiconductor substrate 10 according to the present embodiment is a large-diameter substrate having an outer diameter of not less than 100 mm, has an amount of warpage of not less than −1.5 mm and not more than 1.5 mm when the substrate temperature is 400° C., and therefore has a high degree of flatness under a high temperature. This can reduce a risk of causing defects such as crack in silicon carbide semiconductor substrate 10 during the manufacturing process in performing a method for manufacturing a silicon carbide semiconductor device using silicon carbide semiconductor substrate 10. Specifically, discussion is now directed to, for example, a case where in the method for manufacturing the silicon carbide semiconductor device, doping is performed by means of ion implantation into silicon carbide semiconductor substrate 10 under a high temperature and where silicon carbide semiconductor substrate 10 is suctioned using an electrostatic chuck stage of an ion implantation apparatus. In this case, the amount of warpage of silicon carbide semiconductor substrate 10 under a high temperature (400° C.) is sufficiently small, so that no large stress is applied to silicon carbide semiconductor substrate 10 by suctioning. This can reduce a risk of causing defects such as breakage and crack in silicon carbide semiconductor substrate 10.

Further, silicon carbide semiconductor substrate 10 according to the present embodiment is a large-diameter substrate having an outer diameter of not less than 100 mm, and has a high degree of flatness under a high temperature, with the result that silicon carbide semiconductor devices having small variation in characteristics can be produced on silicon carbide semiconductor substrate 10 when performing the process of manufacturing silicon carbide semiconductor devices using silicon carbide semiconductor substrate 10. Specifically, also in a step of performing a process to main surface 2A of silicon carbide semiconductor substrate 10 in a specific direction such as ion implantation into silicon carbide semiconductor substrate 10, the high degree of flatness of main surface 2A can suppress occurrence of such a problem that the position and configuration of the processed region (implantation region) of main surface 2A is varied locally in main surface 2A. As a result, the variation in process on main surface 2A can be reduced.

Moreover, for exposure with high precision, silicon carbide semiconductor substrate 10 is required to have an LTV (Local Thickness Variation) of not more than 1 for example. In this case, apparent LTV may become large if actual thickness fluctuation of a silicon carbide semiconductor substrate is so small as to be not more than 1 μm but the amount of warpage of the silicon carbide semiconductor substrate is large when the silicon carbide semiconductor substrate is suctioned onto a vacuum chuck stage of an exposure apparatus. In contrast, since silicon carbide semiconductor substrate 10 according to the present embodiment has a small amount of warpage, apparent LTV does not become large, thus allowing for exposure with high precision. As described above, silicon carbide semiconductor devices can be produced with good yield by performing the process of manufacturing silicon carbide semiconductor devices using large-diameter silicon carbide semiconductor substrate 10 having a high degree of flatness.

(2) In silicon carbide semiconductor substrate 10 according to the present embodiment, base substrate 1 may have a thickness of not less than 200 μm and not more than 700 μm in a direction perpendicular to main surface 1A, 2A. Also in this way, silicon carbide semiconductor substrate 10 according to the present embodiment can have an amount of warpage of not less than −1.5 mm and not more than 1.5 mm when the substrate temperature is 400° C. Generally, in the silicon carbide substrate, epitaxial layer 2 formed on main surface 1A of base substrate 1 has a thickness of about not less than several μm and not more than 100 p.m. Hence, when the thickness of base substrate 1 is thin, the amount of warpage of silicon carbide semiconductor substrate 10 becomes large. On the other hand, when the thickness of base substrate 1 is thick, manufacturing cost becomes high. In contrast, silicon carbide semiconductor substrate 10 according to the present embodiment can have a high degree of flatness under a high temperature even though base substrate 1 does not have a thickness of more than 700 μm. In other words, in accordance with the method for manufacturing the silicon carbide substrate according to the present embodiment, silicon carbide semiconductor substrate 10 having a high degree of flatness under a high temperature can be obtained with low cost.

(3) Preferably in silicon carbide semiconductor substrate 10 according to the present embodiment, base substrate 1 has a backside surface 1B opposite to main surface 1A and having a surface roughness of not more than 10 nm. When the surface roughness of backside surface 1B of base substrate 1 is high, it is considered that excess of silicon (Si) of silicon carbide constituting backside surface 1B is removed under a high temperature environment, thereby resulting in formation of a carbonized layer (damaged layer 3). The present inventors have found that a silicon carbide semiconductor substrate having a base substrate 1 with a backside surface 1B having a surface roughness of not more than 10 nm after forming an epitaxial layer 2 on main surface 1A of base substrate 1 has an amount of warpage of not less than −1.5 mm and not more than 1.5 mm when the substrate temperature is 400° C. as described above. Specifically, when silicon carbide semiconductor substrate 10 has a high substrate temperature, the amount of warpage is increased presumably due to, as one example, the following cause: stress is generated by residual distortion of damaged layer 3 formed in backside surface 1B of base substrate 1 in silicon carbide semiconductor substrate 10.

Figure 4:
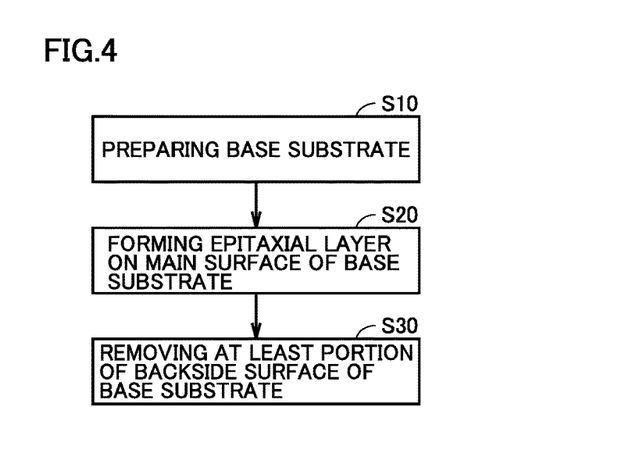
FIG. 4 is a flowchart of a method for manufacturing the silicon carbide semiconductor substrate according to the embodiment.

(4) A method for manufacturing a silicon carbide semiconductor substrate according to the present embodiment includes steps of: preparing (S10) a base substrate 1 that has a main surface 1A having an outer diameter of not less than 100 mm and that is made of single-crystal silicon carbide; forming (S20) an epitaxial layer 2 on main surface 1A; and removing (S30) at least a portion of a backside surface 1B of base substrate 1 opposite to main surface 1A.

That is, in the method for manufacturing the silicon carbide semiconductor substrate according to the present embodiment, a portion of backside surface 1B of base substrate 1 is removed after forming epitaxial layer 2 on main surface 1A of base substrate 1 having an outer diameter of not less than 100 mm and made of single-crystal silicon carbide. Accordingly, even if damaged layer 3 is caused at backside surface 1B of base substrate 1 in the step (S20) of forming epitaxial layer 2, damaged layer 3 is removed in the step (S30) of removing a portion of backside surface 1B of base substrate 1. Silicon carbide semiconductor substrate 10 thus obtained has an outer diameter of not less than 100 mm and has an amount of warpage of not less than −100 μm and not more than 100 μm when the substrate temperature is a room temperature and has an amount of warpage of not less than −1.5 mm and not more than 1.5 mm when the substrate temperature is 400° C. In other words, in accordance with the method for manufacturing the silicon carbide semiconductor substrate according to the present embodiment, silicon carbide semiconductor substrate 10 having a high degree of flatness under a high temperature environment and an outer diameter of not less than 100 mm can be obtained.

(5) In the method for manufacturing the silicon carbide semiconductor substrate according to the present embodiment, the step (S30) of removing may be performed by performing chemical mechanical polishing (CMP) to backside surface 1B. Also in this way, even if damaged layer 3 is caused at backside surface 1B of base substrate 1 in the step (S20) of forming epitaxial layer 2, damaged layer 3 can be securely removed by performing chemical polishing to backside surface 1B of base substrate 1.

(6) In the method for manufacturing the silicon carbide semiconductor substrate according to the present embodiment, the step (S30) of removing may be performed by performing reactive ion etching to backside surface 1B. Also in this way, even if damaged layer 3 is caused at backside surface 1B of base substrate 1 in the step (S20) of forming epitaxial layer 2, damaged layer 3 can be securely removed by performing reactive ion etching to backside surface 1B of base substrate 1.

(7) In the method for manufacturing the silicon carbide semiconductor substrate according to the present embodiment, the step (S30) of removing may be performed by performing thermal etching to backside surface 1B under a halogen gas atmosphere. Also in this way, even if damaged layer 3 is caused at backside surface 1B of base substrate 1 in the step (S20) of forming epitaxial layer 2, damaged layer 3 can be securely removed by performing thermal etching to backside surface 1B of base substrate 1.

(8) In the method for manufacturing the silicon carbide semiconductor substrate according to the present embodiment, the step (S30) of removing may be performed by forming a thermal oxidation film at backside surface 1B and then etching the thermal oxidation film using hydrofluoric acid. Also in this way, even if damaged layer 3 is caused at backside surface 1B of base substrate 1 in the step (S20) of forming epitaxial layer 2, damaged layer 3 can be securely removed by using hydrofluoric acid to etch the thermal oxidation film formed at backside surface 1B of base substrate 1.

Figure 9:
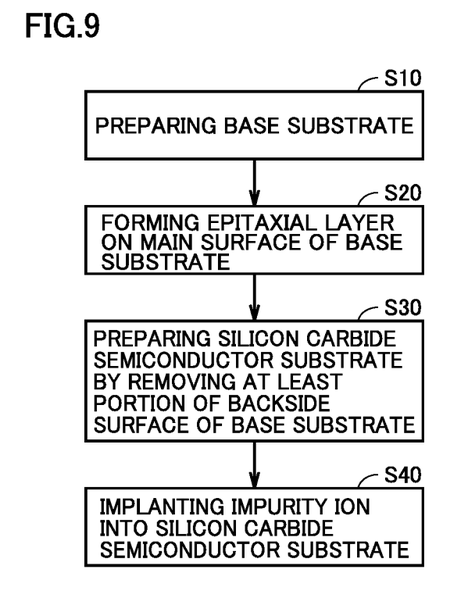
FIG. 9 is a flowchart of the method for manufacturing the silicon carbide semiconductor device according to the embodiment.

(9) A method for manufacturing a silicon carbide semiconductor device according to the present embodiment includes steps of: preparing (S10) a base substrate 1 that has a main surface 1A having an outer diameter of not less than 100 mm and that is made of single-crystal silicon carbide; forming (S20) an epitaxial layer 2 on main surface 1A; preparing (S30) a silicon carbide semiconductor substrate 10 by removing at least a portion of a backside surface 1B of base substrate 1 opposite to main surface 1A; and implanting (S40) an impurity ion into silicon carbide semiconductor substrate 10.

That is, in the method for manufacturing the silicon carbide semiconductor device according to the present embodiment, silicon carbide semiconductor substrate 10 obtained by the method for manufacturing the silicon carbide semiconductor substrate according to the present embodiment is used and a silicon carbide semiconductor device is manufactured on silicon carbide semiconductor substrate 10. As described above, silicon carbide semiconductor substrate 10 obtained by the method for manufacturing the silicon carbide semiconductor substrate according to the present embodiment has an outer diameter of not less than 100 mm and has an amount of warpage of not less than −100 μm and not more than 100 μm when the substrate temperature is a room temperature and has an amount of warpage of not less than −1.5 mm and not more than 1.5 mm when the substrate temperature is 400° C. That is, for example, even when heating is performed at a substrate temperature of about 400° C. in the step (S40) of implanting an impurity ion into silicon carbide semiconductor substrate 10, silicon carbide semiconductor substrate 10 can be suppressed from being warped and can be maintained to be flat. Hence, an angle formed by the implantation direction of the impurity relative to main surface 2A of silicon carbide semiconductor substrate 10 in the step (S40) can be substantially constant irrespective of an in-plane location in main surface 2A of silicon carbide semiconductor substrate 10 even when the outer diameter of silicon carbide semiconductor substrate 10 is not less than 100 mm. As a result, irrespective of the in-plane location in main surface 2A, the configuration of the ion implantation region (such as the shape of the implantation region or the ion concentration profile in the depth direction of the substrate or the like) can be substantially constant. Therefore, in accordance with the method for manufacturing the silicon carbide semiconductor device according to the present embodiment, silicon carbide semiconductor devices can be produced with good yield.

[Details of Embodiments of the Invention of the Present Application]

Next, details of embodiments of the present invention will be described.

(First Embodiment)

With reference to FIG. 1, a silicon carbide semiconductor substrate 10 according to a first embodiment will be described. Silicon carbide semiconductor substrate 10 according to the present embodiment includes: a base substrate 1; and an epitaxial layer 2 formed on main surface 1A of base substrate 1.

Base substrate 1 is made of single-crystal silicon carbide, and has main surface 1A having an outer diameter of 6 inches. Base substrate 1 is made of silicon carbide having, for example, a hexagonal crystal structure and preferably has a crystalline polymorphism (polytype) of 4H—SiC. Base substrate 1 includes an n type impurity such as nitrogen (N) at a high concentration, and has n type conductivity. Base substrate 1 has an impurity concentration of, for example, about not less than $1.0 \times 10^{18}$ cm$^{-3}$ and not more than $1.0 \times 10^{18}$ cm$^{-3}$. Main surface 1A may correspond to a {0001} plane, and may correspond to a plane having an off angle of not less than 1° and not more than 10° relative to the {0001} plane, for example. Base substrate 1 has a thickness of, for example, about not less than 200 μm and not more than 700 μm, preferably, not less than 300 μm and not more than 600 μm. In silicon carbide semiconductor substrate 10, no damaged layer 3 of carbon of silicon carbide (see FIG. 6) is formed at backside surface 1B of base substrate 1 opposite to main surface 1A of base substrate 1. It should be noted that damaged layer 3 will be described later.

Epitaxial layer 2 is a layer made of silicon carbide formed on main surface 1A of base substrate 1 by epitaxial growth. Epitaxial layer 2 includes an n type impurity such as nitrogen (N), and epitaxial layer 2 has n type conductivity. The impurity concentration of epitaxial layer 2 may be lower than the impurity concentration of base substrate 1. The impurity concentration of epitaxial layer 2 is about $7.5 \times 10^{15}$ cm$^{-2}$, for example. Epitaxial layer 2 has a film thickness of about not less than 5 μm and not more than 40 μm, for example.

When the substrate temperature is a room temperature, silicon carbide semiconductor substrate 10 has an amount of warpage of not less than −100 μm and not more than 100 μm, preferably, not less than −40 μm and not more than 40 μm. Meanwhile, when the substrate temperature is not less than 100° C. and not more than 500° C., silicon carbide semiconductor substrate 10 has an amount of warpage of not less than −1.5 mm and not more than 1.5 mm, preferably, not less than −1.0 mm and not more than 1.0 mm. More preferably, when the substrate temperature is not less than 200° C. and not more than 400° C., the amount of warpage is not less than −1.5 mm and not more than 1.5 mm, further preferably, not less than −1.0 mm and not more than 1.0 mm.

Next, with reference to FIG. 4 to FIG. 7, the following describes a method for manufacturing the silicon carbide semiconductor substrate according to the present embodiment.

Figure 5:
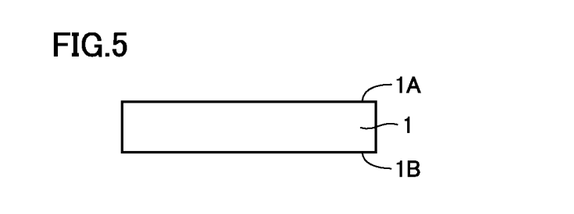
FIG. 5 illustrates a method for manufacturing a silicon carbide semiconductor device according to the embodiment.

With reference to FIG. 4 and FIG. 5, first, base substrate 1 is prepared (step (S10)), which has main surface 1A having an outer diameter of 6 inches and is made of single-crystal silicon carbide. Base substrate 1 having an outer diameter of 6 inches is prepared by any method. It should be noted that the outer diameter of base substrate 1 may be not less than 100 mm (for example, 5 inches, 8 inches, or the like).

Figure 6:
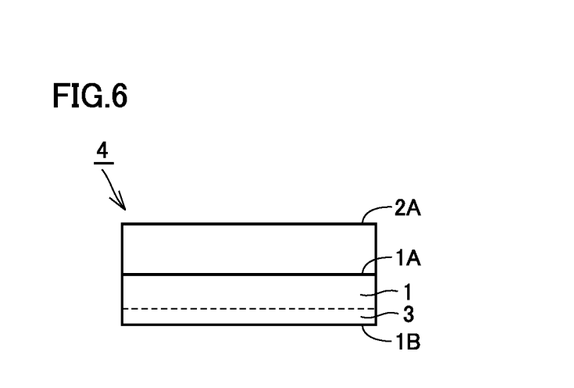
FIG. 6 illustrates the method for manufacturing the silicon carbide semiconductor device according to the embodiment.

Next, with reference to FIG. 6, epitaxial layer 2 is formed on main surface 1A of base substrate 1 by epitaxial growth (step (S20)). The epitaxial growth is performed by a CVD method. As a source material gas, a mixed gas of silane (SiH$_4$) and propane (C$_3$H$_8$) can be used, for example. On this occasion, nitrogen (N) or phosphorus (P) may be introduced as an impurity, for example.

At a point of time after performing this step (S20), silicon (Si) atoms are removed at the whole of or part of backside surface 1B of base substrate 1, which may result in formation of damaged layer 3 (carbonized layer) including carbon (C) atoms at a relatively high concentration. Damaged layer 3 may be formed to have, for example, a thickness of about not less than 0.001 μm and not more than 10 μm, and can be possibly observed by eyes as whiting in backside surface 1B when damaged layer 3 is formed to have a thickness of not less than 1 μm. In backside surface 1B, a region having damaged layer 3 formed thereon has a surface roughness (Ra) of not less than 0.001 μm. At a point of time after performing this step (S20), a stack 4, made up of base substrate 1 having damaged layer 3 formed on backside surface 1B and epitaxial layer 2, has a warpage of, for example, not less than −150 μm and not more than 150 μm in the case where the substrate temperature is a room temperature.

Figure 7:
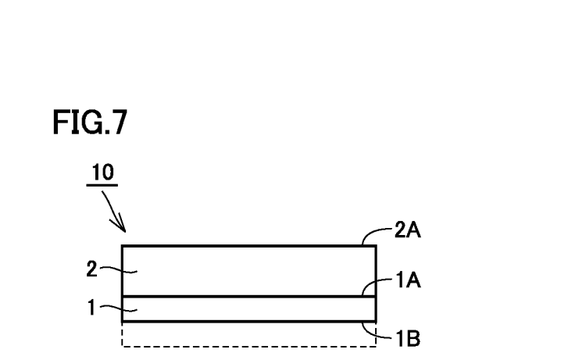
FIG. 7 illustrates the method for manufacturing the silicon carbide semiconductor device according to the embodiment.

Next, with reference to FIG. 7, at least a portion of backside surface 1B of base substrate 1 is removed (step (S30)). Specifically, backside surface 1B of base substrate 1 in stack 4 is polished by CMP, thereby removing damaged layer 3. Backside surface 1B of base substrate 1 is polished by a polishing amount of not less than 0.001 μm and not more than 10 μm, for example. After the polishing in the step (S30), backside surface 1B has a surface roughness (Ra) of not more than 10 nm, preferably, not more than 1 nm.

Next, the following describes function and effect of silicon carbide semiconductor substrate 10 and the method for manufacturing silicon carbide semiconductor substrate 10 according to the present embodiment. Silicon carbide semiconductor substrate 10 according to the present embodiment is configured such that damaged layer 3 is removed from backside surface 1B of stack 4 including base substrate 1 having an outer diameter of 6 inches and epitaxial layer 2 formed on main surface 1A of base substrate 1. Accordingly, silicon carbide semiconductor substrate 10 can have a warpage of not less than −100 μm and not more than 100 μm when the substrate temperature is a room temperature, and can have an amount of warpage of not less than −1.5 mm and not more than 1.5 mm when the substrate temperature is not less than 100° C. and not more than 500° C. Furthermore, silicon carbide semiconductor substrate 10 also can have a warpage of not less than −100 μm and not more than 100 μm when the substrate temperature is the room temperature, and can have an amount of warpage of not less than −1.5 mm and not more than 1.5 mm when the substrate temperature is not less than 200° C. and not more than 400° C. Moreover, in the present embodiment, the surface roughness of backside surface 1B can be employed to check whether or not the amount of warpage can be reduced to fall within the above-described range of amount of warpage when the substrate temperature is not less than 100° C. and not more than 500° C., i.e., whether or not damaged layer 3 has been removed sufficiently. Specifically, with the surface roughness (Ra) being not more than 10 nm, there can be obtained silicon carbide semiconductor substrate 10 having a small amount of warpage under a high temperature as described above. Furthermore, by polishing backside surface 1B to attain a surface roughness (Ra) of not more than 1 nm, damaged layer 3 can be sufficiently removed. As a result, in accordance with the method for manufacturing the silicon carbide semiconductor substrate according to the present embodiment, even when heating is performed until the substrate temperature becomes about not less than 100° C. and not more than 500° C., there can be obtained silicon carbide semiconductor substrate 10 having a sufficiently small amount of warpage of not less than −1.0 mm and not more than 1.0 mm. Moreover, in accordance with the method for manufacturing the silicon carbide semiconductor substrate according to the present embodiment, even when heating is performed until the substrate temperature becomes about not less than 200° C. and not more than 400° C., there can be also obtained silicon carbide semiconductor substrate 10 having a sufficiently small amount of warpage of not less than −1.0 mm and not more than 1.0 mm.

Moreover, silicon carbide semiconductor substrate 10 produced by the method for manufacturing the silicon carbide semiconductor substrate according to the present embodiment is small in amount of warpage and has a high degree of flatness even when the outer diameter of base substrate 1 is 6 inches, the thickness of base substrate 1 is not less than 200 μm and not more than 700 μm, and heating is performed at a substrate temperature of about not less than 100° C. and not more than 500° C. In other words, silicon carbide semiconductor substrate 10 according to the present embodiment has a high degree of flatness under a high temperature even when base substrate 1 does not have a thickness of more than 700 μm. As a result, in accordance with the method for manufacturing the silicon carbide semiconductor substrate according to the present embodiment, silicon carbide semiconductor substrate 10 having a large diameter and a high degree of flatness under a high temperature can be obtained with low cost.

Figure 8:
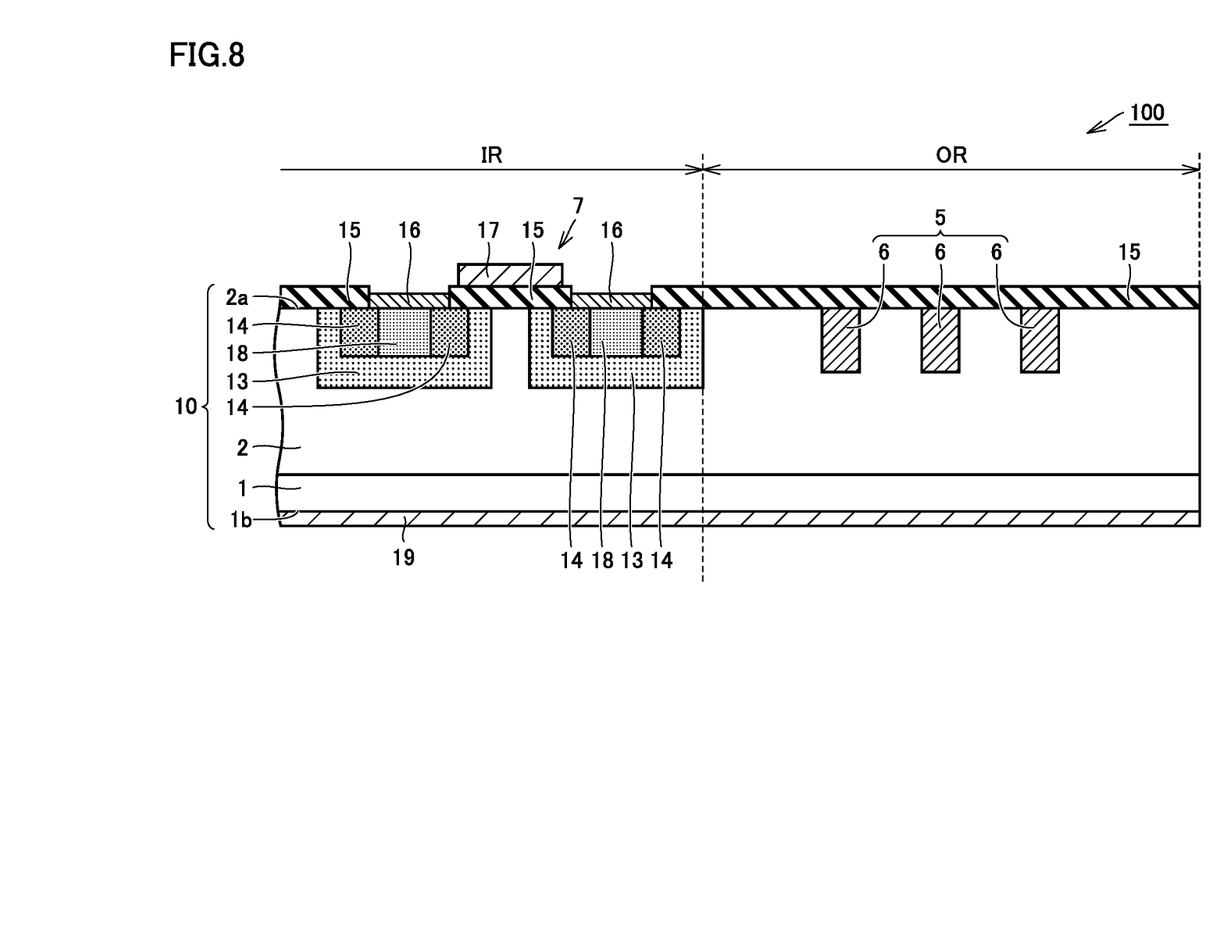
FIG. 8 is a schematic view of the silicon carbide semiconductor device according to the embodiment.

Next, with reference to FIG. 8, a silicon carbide semiconductor device according to the present embodiment will be described. The silicon carbide semiconductor device according to the present embodiment includes: an element region IR (active region); and a termination region OR (inactive region) surrounding element region IR. Termination region OR includes a guard ring region 5. That is, element region IR is surrounded by guard ring region 5. In element region IR, a semiconductor element 7 such as transistor or diode is provided.

Semiconductor element 7 mainly includes: silicon carbide semiconductor substrate 10 made of, for example, hexagonal silicon carbide, a gate insulating film 15, a gate electrode 17, a source electrode 16, and a drain electrode 19. Silicon carbide semiconductor substrate 10 includes base substrate 1 and epitaxial layer 2, and epitaxial layer 2 mainly includes a drift region 12, p body regions 13, n+ source regions 14, and p+ regions 18

Drift region 12 is a region included in epitaxial layer 2 and not provided with p body region 13, n+ source region 14, and p+ region 18.

P body region 13 has p type conductivity. P body region 13 is formed in drift region 12 to include main surface 2A of silicon carbide semiconductor substrate 10. P body region 13 includes a p type impurity such as aluminum (Al) or boron (B). The concentration of the impurity such as aluminum in p body region 13 is, for example, about $1\times10^{17}$ $cm^{-3}$.

N+ source region 14 has n type conductivity. N+ source region 14 includes main surface 2A, and is formed in p body region 13 to be surrounded by p body region 13. N+ source region 14 includes an n type impurity such as P (phosphorus), for example. The concentration of the impurity such as phosphorus in n+ source region 14 is higher than the concentration of the n type impurity in drift region 12, such as about $1\times10^{20}$ $cm^{-3}$.

P+ source 18 has p type conductivity type. P+ source 18 is formed in contact with main surface 2A and p body region 13 so as to extend through n+ source region 14 in the vicinity of the center of n+ source region 14. P+ source 18 includes a p type impurity such as Al or B at a concentration higher than the concentration of the p type impurity included in p body region 13, such as about $1\times10^{20}$ $cm^{-3}$.

Gate insulating film 15 is formed in contact with drift region 12 to extend from above the upper surface of one n+ source region 14 to above the upper surface of the other n+ source region 14. Gate insulating film 15 is made of, for example, silicon dioxide ($SiO_2$).

Gate electrode 17 is disposed on and in contact with gate insulating film 15 so as to extend from above one n+ source region 14 to above the other n+ source region 14. For example, gate electrode 17 is made of a conductor such as polysilicon or Al.

In main surface 2A, source electrode 16 is provided in contact with n+ source region 14 and p+ region 18. Source electrode 16 includes titanium (Ti) atoms, Al atoms, and silicon (Si) atoms, for example. Accordingly, source electrode 16 can be in ohmic contact with both the n type silicon carbide region (n+ source region 14) and the p type silicon carbide region (p+ region 18).

Drain electrode 19 is formed in contact with backside surface 1B in silicon carbide semiconductor substrate 10. This drain electrode 19 may have the same configuration as source electrode 16, or may be made of a different material capable of ohmic contact with silicon carbide semiconductor substrate 10 (base substrate 1) such as nickel (Ni), for example. Accordingly, drain electrode 19 is electrically connected to base substrate 1.

Guard ring region 5, which has a loop-like planar shape, is provided in termination region OR of silicon carbide semiconductor substrate 10 so as to surround element region IR in which semiconductor element 7 is provided. Guard ring region 5 has p type (second conductivity type). Guard ring region 5 is an electrically conductive region serving as a guard ring.

Guard ring region 5 has a plurality of guard rings 6 each including an impurity such as boron or aluminum, for example. The concentration of the impurity in each of the plurality of guard rings 6 is lower than the concentration of the impurity in p body region 13. For example, the concentration of the impurity in each of the plurality of guard rings 6 is $1.3 \times 10^{13}$ cm$^{-3}$, preferably, about not less than $8 \times 10^{12}$ cm$^{-3}$ and not more than $1.4 \times 10^{13}$ cm$^{-3}$, for example.

Next, with reference to FIG. 9, a method for manufacturing the silicon carbide semiconductor device according to the present embodiment will be described. In the method for manufacturing the silicon carbide semiconductor device according to the present embodiment, the silicon carbide semiconductor substrate according to the present embodiment is used for the production thereof.

First, silicon carbide semiconductor substrate 10 obtained as described above is prepared (step (S10) to step (S30)). Next, with reference to FIG. 9, an impurity is implanted into main surface 2A of silicon carbide semiconductor substrate 10, thereby forming p body region 13, n source region 14, p+ region 18, and guard ring region 5 in epitaxial layer 2 (step (S40)). Specifically, for example, ions of Al are implanted as a p type impurity into epitaxial layer 2 having n type conductivity, thereby forming p body region 13 having p type conductivity. Furthermore, for example, ions of P are implanted into p body region 13 as an n type impurity, thereby forming n source region 14 having n type conductivity. Furthermore, for example, ions of Al are implanted as a p type impurity, thereby forming p+ region 18 having p type conductivity. Further, for example, ions of Al are implanted as a p type impurity, thereby forming guard ring region 5 having p type conductivity. On this occasion, the ion implantation in this step (S40) is performed with the substrate temperature of silicon carbide semiconductor substrate 10 being increased to, for example, about not less than 100° C. and not more than 500° C. (high-temperature implantation). At a point of time before and after performing this step (S40), silicon carbide semiconductor substrate 10 has an amount of warpage of not less than −1.5 mm and not more than 1.5 mm. Moreover, as described above, in the method for manufacturing the silicon carbide semiconductor substrate according to the present embodiment, by sufficiently removing damaged layer 3 by polishing backside surface 1B to attain a surface roughness (Ra) of, for example, not more than 1 nm, silicon carbide semiconductor substrate 10 can have an amount of warpage of not less than −1.0 mm and not more than 1.0 mm at a point of time before and after performing the step (S40).

Next, heat treatment is performed to activate the impurities added by the ion implantations (step (S50)). The heat treatment is preferably performed at a temperature of not less than 1500° C. and not more than 1900° C., for example, a temperature of approximately 1700° C. The heat treatment is performed for approximately 30 minutes, for example. The atmosphere of the heat treatment is preferably an inert gas atmosphere, such as argon (Ar) atmosphere. At a point of time after performing this step (S50), silicon carbide semiconductor substrate 10 has an amount of warpage of not less than −1.5 mm and not more than 1.5 mm. Moreover, as described above, in the method for manufacturing the silicon carbide semiconductor substrate according to the present embodiment, by sufficiently removing damaged layer 3 by polishing backside surface 1B to attain a surface roughness (Ra) of, for example, not more than 1 nm, silicon carbide semiconductor substrate 10 can have an amount of warpage of not less than −1.0 mm and not more than 1.0 mm at a point of time before and after performing the step (S50).

Next, gate insulating film 15 is formed (step (S60)). Specifically, silicon carbide semiconductor substrate 10 having the desired impurity regions formed therein is first thermally oxidized. The thermal oxidation can be performed by, for example, performing heating at about 1300° C. in oxygen atmosphere for about 40 minutes. Accordingly, gate insulating film 15 made of $SiO_2$ is formed on main surface 2A of silicon carbide semiconductor substrate 10.

Next, gate electrode 17 is formed (step (S70)). In this step, for example, gate electrode 17 made of a conductor such as polysilicon or Al is formed in contact with gate insulating film 15 so as to extend from above one n+ source region 14 to above the other n+ source region 14. When polysilicon is employed as the material of gate electrode 17, the polysilicon can be configured to include P at a high concentration such as more than $1 \times 10^{20}$ cm$^{-3}$. Then, an insulating film made of, for example, $SiO_2$ is formed to cover gate electrode 17.

Next, an ohmic electrode is formed (step (S80)). Specifically, a resist pattern is formed to have an opening to expose p+ region 18 and a portion of n+ source region 14, and a metal film including Si atoms, Ti atoms, and Al atoms is formed on the entire surface of the substrate, for example. The metal film, which is to serve as the ohmic electrode, is formed by a sputtering method or an evaporation method, for example. Then, the resist pattern is, for example, lifted off to form a metal film in contact with gate insulating film 15, p+ region 18 and n+ source region 14. Then, the metal film is heated at, for example, about 1000° C., thereby forming source electrode 16 in ohmic contact with silicon carbide semiconductor substrate 10. Moreover, drain electrode 19 is formed in ohmic contact with n+ substrate 11 of silicon carbide semiconductor substrate 10. In this way, silicon carbide semiconductor device 100 serving as a MOSFET is completed.

Next, the following describes function and effect of the method for manufacturing the silicon carbide semiconductor device according to the present embodiment. According to the method for manufacturing the silicon carbide semiconductor device according to the present embodiment, silicon carbide semiconductor substrate 10 according to the present embodiment is used in performing a process necessary for manufacturing of a silicon carbide semiconductor device, such as the ion implantation step (S40). Silicon carbide semiconductor substrate 10 has a high degree of flatness even when heat treatment is performed at a high substrate temperature of about not less than 100° C. and not more than 500° C., thereby reducing a risk of causing quality defects by using a silicon carbide semiconductor substrate 10 having a large amount of warpage. For example, when silicon carbide semiconductor substrate 10 having an outer diameter of not less than 100 mm is suctioned using an electrostatic chuck stage of a semiconductor manufacturing apparatus, the amount of warpage of silicon carbide semiconductor substrate 10 is preferably not less than −1.5 mm and not more than 1.5 mm, more preferably, not less than −1.0 mm and not more than 1.0 mm in view of a risk of occurrence of defects such as occurrence of crack in silicon carbide semiconductor substrate 10. Silicon carbide semiconductor substrate 10 according to the present embodiment has an amount of warpage of not less than −1.5 mm and not more than 1.5 mm even when heat treatment is performed at a high substrate temperature of about not less than 100° C. and not more than 500° C., thereby reducing the risk of causing defects such as crack in silicon carbide semiconductor substrate 10 by suctioning with an electrostatic chuck stage. Moreover, silicon carbide semiconductor substrate 10 according to the present embodiment has an amount of warpage of not less than −1.5 mm and not more than 1.5 mm even when heat treatment has been performed at a high substrate temperature of about not less than 200° C. and not more than 400° C., thereby reducing the risk of causing defects such as crack in silicon carbide semiconductor substrate 10 by suctioning with an electrostatic chuck stage. Further, silicon carbide semiconductor substrate 10 from which damaged layer 3 has been sufficiently removed has an amount of warpage reduced to not less than −1.0 mm and not more than 1.0 mm, when heat treatment is performed at a high substrate temperature of about not less than 100° C. and not more than 500° C. This further reduces the risk of causing defects such as crack in silicon carbide semiconductor substrate 10 by suctioning with an electrostatic chuck stage. Further, silicon carbide semiconductor substrate 10 from which damaged layer 3 has been sufficiently removed has an amount of warpage reduced to not less than −1.0 mm and not more than 1.0 mm, when heat treatment is performed at a high substrate temperature of about not less than 200° C. and not more than 400° C. This further reduces the risk of causing defects such as crack in silicon carbide semiconductor substrate 10 by suctioning with an electrostatic chuck stage.

Figure 10:
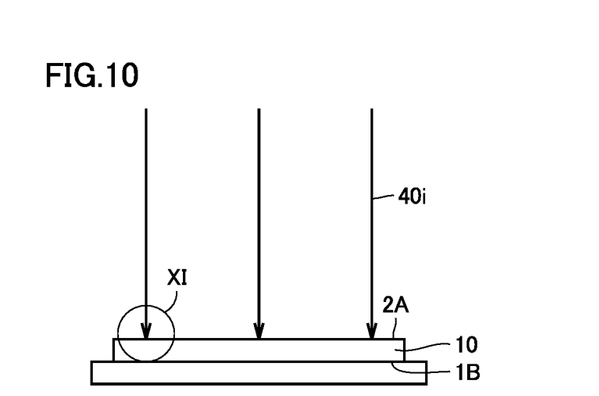
FIG. 10 illustrates function and effect of the method for manufacturing the silicon carbide semiconductor device according to the embodiment.
Figure 11:
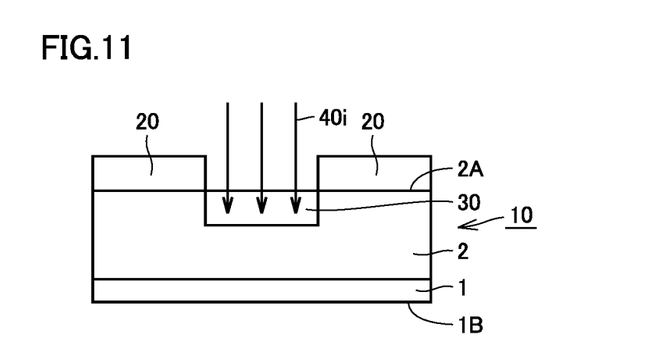
FIG. 11 illustrates function and effect of the method for manufacturing the silicon carbide semiconductor device according to the embodiment.

Moreover, in the method for manufacturing the silicon carbide semiconductor device according to the present embodiment, silicon carbide semiconductor substrate 10 having high degree of flatness and high parallelism of main surface 2A is employed, thereby reducing a risk associated with occurrence of defects such as variation of in-plane processing quality in the main surface 2A of silicon carbide semiconductor substrate 10. Accordingly, silicon carbide semiconductor devices 100 can be produced with good yield. Specifically, with reference to FIG. 9, for example, in the step (S40), silicon carbide semiconductor substrate 10 to be subject to the step (S40) has main surface 2A having a high degree of flatness, with the result that an impurity ion implantation angle between main surface 2A and impurity implantation direction 40i (see FIG. 10) has low in-plane variation within main surface 2A. Accordingly, with reference to FIG. 11, an impurity implantation region 30 (such as p body region 13 and n source region 14) is formed uniformly at the central portion and outer circumference portion of silicon carbide semiconductor substrate 10 by implanting an impurity via the opening of mask film 20 formed on main surface 2A of silicon carbide semiconductor substrate 10. From a different point of view, in silicon carbide semiconductor device 100, impurity implantation region 30 has a side wall portion extending in a direction perpendicular to main surface 2A.

Figure 12:
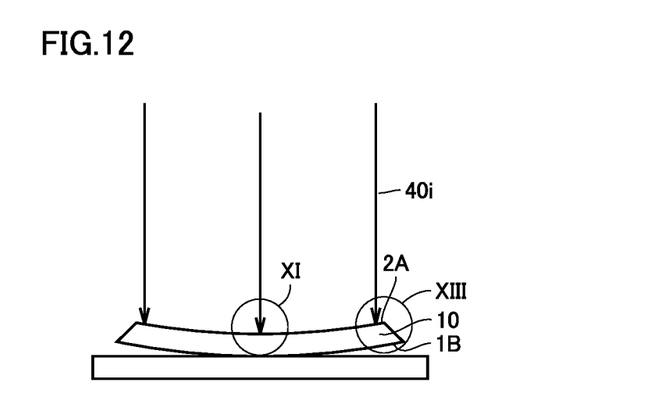
FIG. 12 is a reference diagram for illustrating function and effect of the method for manufacturing the silicon carbide semiconductor device according to the embodiment.
Figure 13:
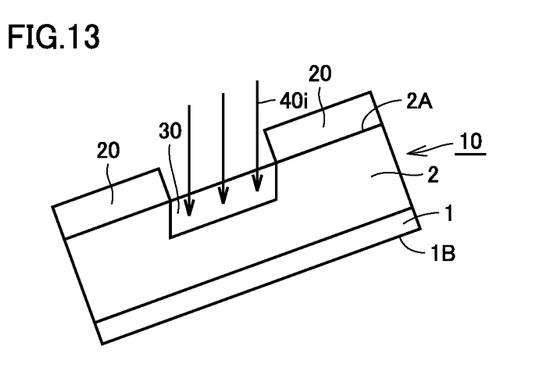
FIG. 13 is a reference diagram for illustrating function and effect of the method for manufacturing the silicon carbide semiconductor device according to the embodiment.

On the other hand, with reference to FIG. 12, in the ion implantation step, if silicon carbide semiconductor substrate 10 has a large amount of warpage and main surface 2A has a low degree of flatness, the ion implantation angle between main surface 2A and impurity implantation direction 40i has large in-plane variation within main surface 2A. In this case, with reference to FIG. 13, impurity implantation region 30 (such as p body region 13 and n source region 14) is varied between the central portion and the outer circumference portion of silicon carbide semiconductor substrate 10 in terms of the position or manner of expansion of the region formed in silicon carbide semiconductor substrate 10. From a different point of view, in silicon carbide semiconductor device 100, impurity implantation region 30 is locally varied in main surface 2A in terms of a direction of extension of the side wall portion with respect to main surface 2A. That is, in accordance with the method for manufacturing the silicon carbide semiconductor device according to the present embodiment, even when large-diameter silicon carbide semiconductor substrate 10 having an outer diameter of not less than 100 mm is used, impurity implantation region 30 can be formed in the entire main surface 2A of silicon carbide semiconductor substrate 10 to have a side wall portion extending perpendicularly to main surface 2A. Accordingly, such a problem never arises that the shape of impurity implantation region 30 (for example, the direction in which the side wall portion extends) differs locally in main surface 2A, thereby obtaining silicon carbide semiconductor device 100 with good yield.

In the method for manufacturing the silicon carbide semiconductor substrate according to the present embodiment, the step (S30) of removing a portion of backside surface 1B is performed by performing chemical polishing to backside surface 1B; however, the present invention is not limited to this. The step (S30) of removing a portion of backside surface 1B may be performed by performing reactive ion etching (RIE) to backside surface 1B, for example. In this case, ICP-RIE (Inductive Coupled Plasma-Reactive Ion Etching) can be used which employs $SF_6$ or a mixed gas of $SF_6$ and $O_2$ as a reactive gas, for example. It should be noted that when RIE is used, damaged layer 3 is removed, but the surface roughness of backside surface 1B is not changed greatly before and after removing a portion of backside surface 1B.

Moreover, the step (S30) of removing a portion of backside surface 1B may be performed by performing thermal etching to backside surface 1B under a halogen gas atmosphere, for example. On this occasion, a protective film may be formed on main surface 2A. The protective film may be a thermal oxidation film, for example. The halogen gas includes chlorine ($Cl_2$) gas, for example. In this case, silicon carbide semiconductor substrate 10 may be heated at about not less than 700° C. and about not more than 1000° C., for example. Moreover, the step (S30) of removing a portion of backside surface 1B may be performed by forming a thermal oxidation film at backside surface 1B and then etching the thermal oxidation film using hydrofluoric acid (HF), for example. Also in this way, damaged layer 3 can be removed.

Moreover, the silicon carbide semiconductor device according to the present embodiment may have a field stop region (not shown) to surround guard ring region 5. The field stop region may be formed in the impurity implantation step (S40) to have n type conductivity, by means of high-temperature implantation in the same manner as that for source region 14 and the like. The silicon carbide semiconductor device according to the present embodiment is produced using silicon carbide semiconductor substrate 10 having a high degree of flatness even under high temperature environment, thereby suppressing occurrence of a problem such as guard ring region 5 or the field stop region being varied locally in main surface 2A in terms of position and configuration. Specifically, it is possible to suppress variation of a space between guard ring region 5 and the field stop region in main surface 2A, for example.

Although the embodiment of the present invention has been illustrated as described above, the embodiment can be modified in various manners. Moreover, the scope of the present invention is not limited by the embodiment described above. The scope of the present invention is defined by the terms of the claims, and is intended to include any modifications within the scope and meaning equivalent to the terms of the claims.

INDUSTRIAL APPLICABILITY

The present invention is particularly advantageously applied to a large-diameter silicon carbide semiconductor substrate having an outer diameter of not less than 100 mm, a method for manufacturing the silicon carbide semiconductor substrate, and a method for manufacturing a silicon carbide semiconductor device using the silicon carbide semiconductor substrate.

REFERENCE SIGNS LIST

1: base substrate; 1A: main surface; 1B: backside surface; 2: epitaxial layer; 3: damaged layer; 4: stack; 5: guard ring region; 6: guard ring; 7: semiconductor element; 10: silicon carbide semiconductor substrate; 12: drift region; 13: body region; 14: source region; 15: gate insulating film; 16: source electrode; 17: gate electrode; 18: p+ region; 19: drain electrode; 20: mask film; 30: impurity implantation region; 100: silicon carbide semiconductor device.

The invention claimed is:
1. A silicon carbide semiconductor substrate comprising:
a base substrate that has a main surface having an outer diameter of not less than 100 mm and that is made of single-crystal silicon carbide; and
an epitaxial layer made of silicon carbide formed on said main surface,
said silicon carbide semiconductor substrate having an amount of warpage of not less than −100 μm and not more than 100 μm when a substrate temperature is a room temperature and having an amount of warpage of not less than −1.5 mm and not more than 1.5 mm when the substrate temperature is 400° C.,
wherein said base substrate has a thickness of not less than 200 μm and not more than 700 μm in a direction perpendicular to said main surface.
2. A silicon carbide semiconductor substrate comprising:
a base substrate that has a main surface having an outer diameter of not less than 100 mm and that is made of single-crystal silicon carbide; and
an epitaxial layer made of silicon carbide formed on said main surface,
said silicon carbide semiconductor substrate having an amount of warpage of not less than −100 μm and not more than 100 μm when a substrate temperature is a room temperature and having an amount of warpage of not less than −1.5 mm and not more than 1.5 mm when the substrate temperature is 400° C.,
wherein said base substrate has a backside surface opposite to said main surface and having a surface roughness of not more than 10 nm.
3. A silicon carbide semiconductor substrate comprising:
a base substrate that has a main surface having an outer diameter of not less than 100 mm and that is made of single-crystal silicon carbide, the base substrate having a thickness of not less than 200 μm and not more than 700 μm in a direction perpendicular to said main surface; and
an epitaxial layer formed on said main surface,
said silicon carbide semiconductor substrate having an amount of warpage of not less than −100 μm and not more than 100 μm when a substrate temperature is a room temperature and having an amount of warpage of not less than −1.5 mm and not more than 1.5 mm when the substrate temperature is 400° C.,
wherein a damaged layer of the base substrate from a surface opposite the main surface of the base substrate is removed.

* * * * *